(12) United States Patent
Yang

(10) Patent No.: US 11,888,025 B2
(45) Date of Patent: Jan. 30, 2024

(54) SILICON ON INSULATOR (SOI) DEVICE AND FORMING METHOD THEREOF

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 11 days.

(21) Appl. No.: 17/079,552

(22) Filed: Oct. 26, 2020

(65) Prior Publication Data

US 2022/0130956 A1 Apr. 28, 2022

(51) Int. Cl.
| | |
|---|---|
| H01L 29/06 | (2006.01) |
| H01L 29/24 | (2006.01) |
| H01L 27/12 | (2006.01) |
| H01L 29/34 | (2006.01) |
| H01L 29/10 | (2006.01) |
| H01L 21/322 | (2006.01) |

(52) U.S. Cl.
CPC ...... *H01L 29/0665* (2013.01); *H01L 21/3226* (2013.01); *H01L 27/1203* (2013.01); *H01L 29/1083* (2013.01); *H01L 29/24* (2013.01); *H01L 29/34* (2013.01)

(58) Field of Classification Search
CPC .................................................. H01L 29/0665
See application file for complete search history.

(56) References Cited

U.S. PATENT DOCUMENTS

| | | | |
|---|---|---|---|
| 8,741,739 B2 | 6/2014 | Botula | |
| 8,835,281 B2 | 9/2014 | Brindle | |
| 9,761,546 B2 | 9/2017 | Cheng | |
| 9,847,266 B2 | 12/2017 | Kim | |
| 10,217,766 B2 | 2/2019 | Cai | |
| 10,276,371 B2 | 4/2019 | Englekirk | |
| 2015/0069366 A1* | 3/2015 | Lunt | H10K 50/11 257/40 |
| 2016/0351437 A1* | 12/2016 | Peidous | H01L 21/76254 |
| 2020/0126847 A1* | 4/2020 | Wang | H01L 21/0245 |

* cited by examiner

*Primary Examiner* — Matthew C Landau
*Assistant Examiner* — Mark Hatzilambrou
(74) *Attorney, Agent, or Firm* — Winston Hsu

(57) ABSTRACT

A silicon on insulator (SOI) device includes a wafer and a trap-rich layer. The wafer includes a top silicon layer disposed on a buried oxide layer. The trap-rich layer having nano-dots and an oxide layer are stacked on a high resistivity substrate sequentially, wherein the oxide layer is bonded with the buried oxide layer. Or, a silicon on insulator (SOI) device includes a wafer and a high resistivity substrate. The wafer includes a top silicon layer disposed on a buried oxide layer. The high resistivity substrate is bonded with the buried oxide layer, wherein a positive fixed charge layer is induced at a surface of the buried oxide layer contacting the high resistivity substrate, and a doped negative charge layer is right next to the positive fixed charge layer. The present invention also provides a method of forming said silicon on insulator (SOI) device.

5 Claims, 2 Drawing Sheets

SILICON ON INSULATOR (SOI) DEVICE AND FORMING METHOD THEREOF

BACKGROUND OF THE INVENTION

1. Field of the Invention

The present invention relates generally to a silicon on insulator (SOI) device and forming method thereof, and more specifically to a silicon on insulator (SOI) device applying trapping layers or implanting negative charges and forming method thereof.

2. Description of the Prior Art

Integrated circuits are formed on semiconductor substrates and are packaged to form so-called chips or microchips. Traditionally, integrated circuits are formed on bulk semiconductor substrates comprising semiconductor material, such as silicon. In more recent years, semiconductor-on-insulator (SOI) substrates have emerged as an alternative. SOI substrate has a thin layer of active semiconductor separated from an underlying handle substrate by a layer of insulating material. The layer of insulating material electrically isolates the thin layer of active semiconductor from the handle substrate, thereby reducing current leakage of devices formed within the thin layer of active semiconductor. The thin layer of active semiconductor provides advantages. One advantage is dramatic decrease in parasitic capacitance which allows access to a more desirable power-speed performance horizon. Thus, SOI devices are particularly widely used for high frequency devices.

SUMMARY OF THE INVENTION

The present invention provides a silicon on insulator (SOI) device and forming method thereof, which forms negative carriers right next to an induced positive fixed charge layer, to wipe out positive charges, thereby interrupting parasitic surface conduction (PSC) channels and thus reducing substrate loss.

The present invention provides a silicon on insulator (SOI) device including a wafer and a trap-rich layer. The wafer includes a top silicon layer disposed on a buried oxide layer. The trap-rich layer having nano-dots and an oxide layer are stacked on a high resistivity substrate sequentially, wherein the oxide layer is bonded with the buried oxide layer.

The present invention provides a silicon on insulator (SOI) device including a wafer and a high resistivity substrate. The wafer includes a top silicon layer disposed on a buried oxide layer. The high resistivity substrate is bonded with the buried oxide layer, wherein a positive fixed charge layer is induced at a surface of the buried oxide layer contacting the high resistivity substrate, and a doped negative charge layer is right next to the positive fixed charge layer.

The present invention provides a method of forming a silicon on insulator (SOI) device including the following steps. A wafer including a bottom silicon substrate, a buried oxide layer and a top silicon layer stacked from bottom to top is provided. The bottom silicon substrate is removed to expose the buried oxide layer. A high resistivity substrate is provided. A trap-rich layer is deposited on the high resistivity substrate. An oxide layer is deposited on the trap-rich layer. The oxide layer is bonded with the buried oxide layer.

According to the above, the present invention provides a silicon on insulator (SOI) device and forming method thereof, which forms negative carriers right next to an induced positive charge layer, to wipe out positive charges in the induced positive charge layer. In one embodiment, a trap-rich layer having nano-dots is applied to trap negative carriers and wipe out induced positive charges in a positive fixed charge layer induced at a surface. In another embodiment, a doped negative charge layer including negative carriers therein is applied instead, to wipe out the positive charges. Thus, interrupt parasitic surface conduction (PSC) channels, increase effective resistivity in substrates, and reduce harmonic distortion and substrate loss.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
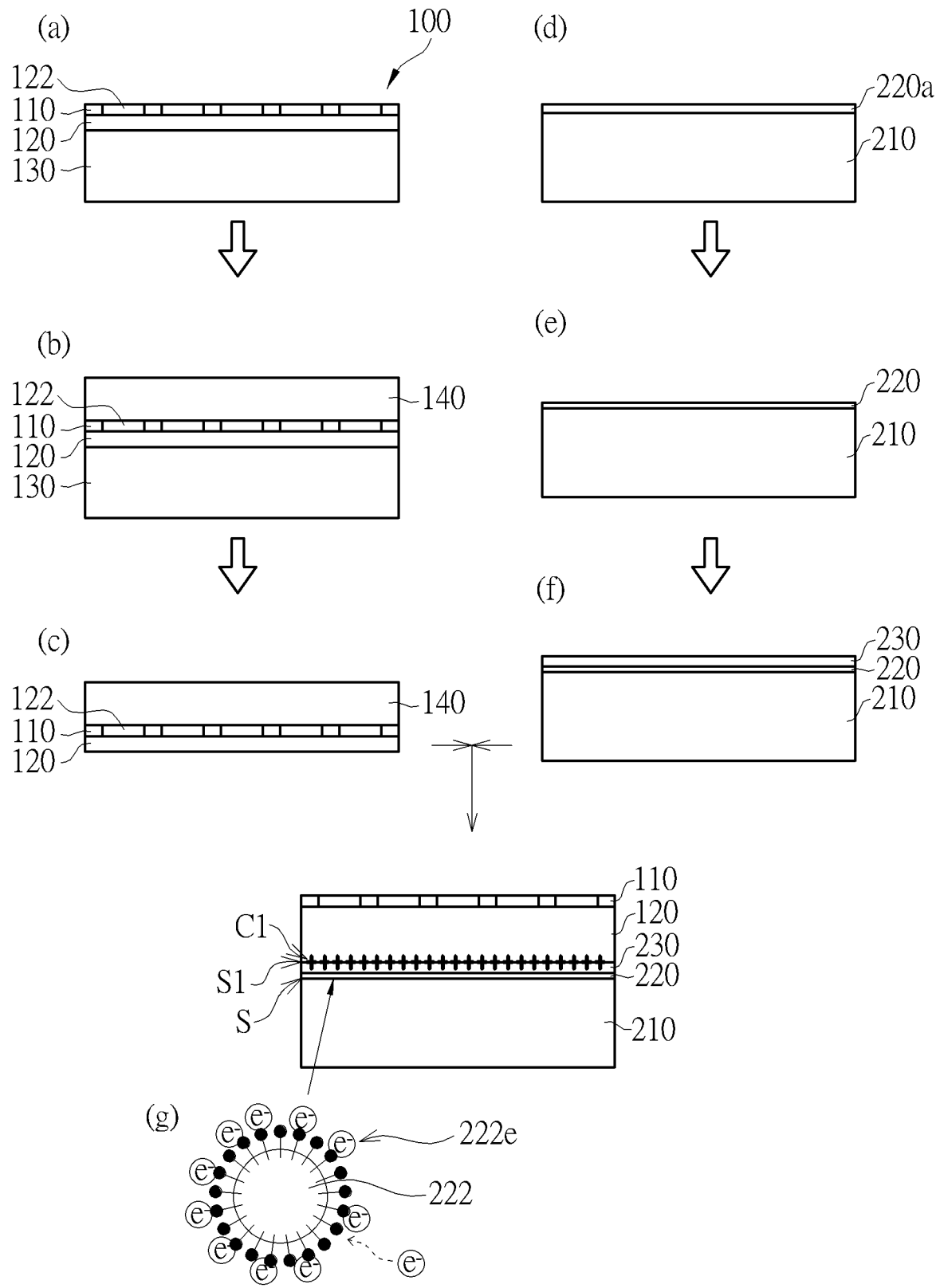
FIG. 1 schematically depicts cross-sectional views of a method of forming a silicon on insulator (SOI) device according to an embodiment of the present invention.

FIG. 1 schematically depicts cross-sectional views of a method of forming a silicon on insulator (SOI) device according to an embodiment of the present invention. As shown in FIG. 1(a), a wafer 100 is provided. In the present invention, a silicon on insulator (SOI) substrate is applied, so that the wafer 100 includes a top silicon layer 110, a buried oxide layer 120 and a bottom silicon layer 130, wherein the bottom silicon layer 130, the buried oxide layer 120 and the top silicon layer 110 are stacked from bottom to top. In this embodiment, radio frequency devices 122 are disposed in the top silicon layer 110, but the present invention is not restricted thereto.

Then, the bottom silicon substrate 130 is removed to expose the buried oxide layer 120, as shown in FIGS. 1(b)-1(c). In one embodiment, a temporary substrate 140 is formed on the top silicon layer 110 as a carrier substrate, as shown in FIG. 1(b), and then the bottom silicon substrate 130 is removed to expose the buried oxide layer 120, as shown in FIG. 1(c).

Moreover, as shown in FIG. 1(d), a high resistivity substrate 210 is provided. The high resistivity substrate 210 may have resistance of 1 kΩ·cm, but it is not limited thereto. Thereafter, a trap-rich layer 220 is deposited on the high resistivity substrate 210, as shown in FIGS. 1(d)-1(e). The trap-rich layer 220 may have a trapping density of 10 $cm^{-2} \cdot eV^{-1}$, but it is not limited thereto. In the present invention, the trap-rich layer 220 has nano-dots 222 therein, so that carriers can be trapped in dangling bonds of the nano-dots 222 to wipe out induced charges at an interface of different layers. A method of depositing the trap-rich layer 220 is presented as follows, but the present invention is not restricted thereto. Please refer to FIG. 1(d), a germanium layer 220a is deposited on the high resistivity substrate 210, wherein the germanium layer 220a may have a thickness of 1 nm. The germanium layer 220a is annealed to form the trap-rich layer 220 having nano-dots 222, i.e., germanium nano-dots. In one case, the germanium layer 220a is annealed by a rapid thermal annealing (RTA) process, but it is not limited thereto.

As shown in FIG. 1(f), an oxide layer 230 is deposited on the trap-rich layer 220 for bonding with the buried oxide layer 120 of FIG. 1(c) by similar materials to have better interface performance. Preferably, the oxide layer 230 is a superficial oxide layer, which may be deposited by an atomic layer deposition (ALD) process or a chemical vapor deposition (CVD) process, but it is not limited thereto.

As shown in FIG. 1(g), the oxide layer 230 of FIG. 1(f) is bonded with the buried oxide layer 120 of FIG. 1(c). Thus, a positive fixed charge layer C1 is induced at a surface S1 of the buried oxide layer 120 contacting the oxide layer 230. Meanwhile, negative carriers 222e are trapped in the trap-rich layer 220 to wipe out positive charges of the positive fixed charge layer C1, hence interrupting parasitic surface conduction (PSC) channels at a surface S of the high resistivity substrate 210, increasing effective resistivity of the high resistivity substrate 210, and reducing harmonic distortion and substrate loss.

More precisely, the negative carriers 222e are trapped in dangling bonds of the nano-dots 222 in the trap-rich layer 220, which is formed right next to the surface S1 (interface) of the buried oxide layer 120 contacting the oxide layer 230, so that the negative carriers 222e can wipe out induced positive charges of the positive fixed charge layer C1 effectively.

Furthermore, the temporary substrate 140 may be removed after the oxide layer 230 of FIG. 1(f) is bonded with the buried oxide layer 120 of FIG. 1(c) for performing later processes.

Figure 2:
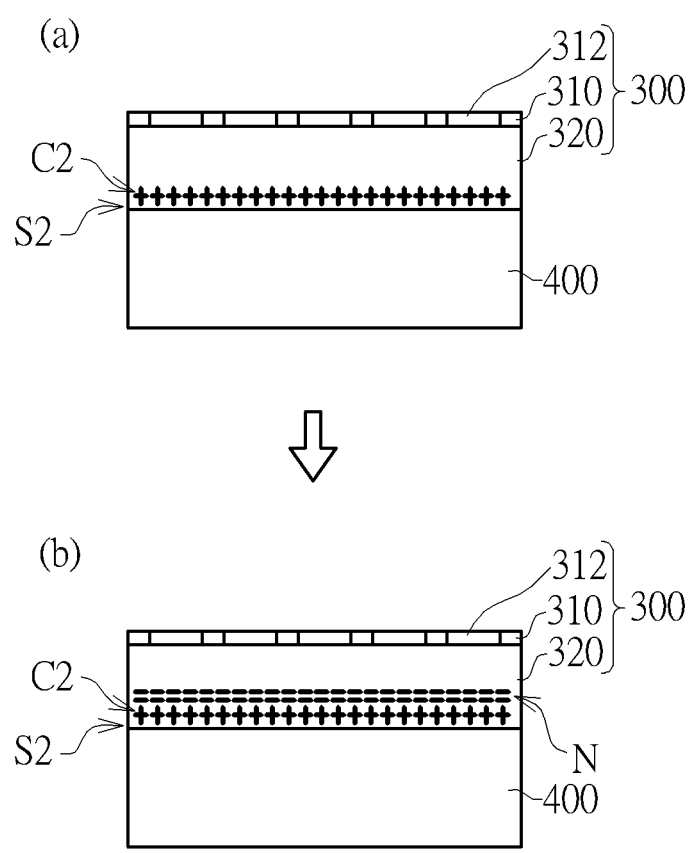
FIG. 2 schematically depicts cross-sectional views of a method of forming a silicon on insulator (SOI) device according to another embodiment of the present invention.

FIG. 2 schematically depicts cross-sectional views of a method of forming a silicon on insulator (SOI) device according to another embodiment of the present invention. As shown in FIG. 2(a), a wafer 300 includes a top silicon layer 310 disposed on a buried oxide layer 320. Radio frequency devices 312 are disposed in the top silicon layer 310. A high resistivity substrate 400 is provided. The high resistivity substrate 400 may have resistance of 1 kΩ·cm, but it is not limited thereto. The high resistivity substrate 400 is bonded with the buried oxide layer 320. In a preferred embodiment, an oxide layer (not shown) may be deposited on the high resistivity substrate 400 first, and the buried oxide layer 320 can be well-bonded with the oxide layer (not shown) of the high resistivity substrate 400, but it is not limited thereto. Steps of forming this structure is similar to the steps of FIG. 1 (except for depositing the trap-rich layer 220 of FIG. 1(e)), and therefore are not described. Since the high resistivity substrate 400 is bonded with the buried oxide layer 320, a positive fixed charge layer C2 is thus induced at a surface S2 of the buried oxide layer 320 contacting the high resistivity substrate 400.

As shown in FIG. 2(b), a doped negative charge layer N is doped right next to the positive fixed charge layer C2, to wiped out positive charges of the positive fixed charge layer C2, hence interrupting parasitic surface conduction (PSC) channels at the surface S2 of the buried oxide layer 320 contacting the high resistivity substrate 400, therefore increasing effective resistivity of the high resistivity substrate 400, and reducing harmonic distortion and substrate loss. Preferably, the doped negative charge layer N is embedded in the buried oxide layer 320 to be disposed close to the positive fixed charge layer C2 without affecting the high resistivity substrate 400. Still preferably, the doped negative charge layer N includes a fluorine doped negative charge layer, but it is not limited thereto. Later processes for forming a silicon on insulator (SOI) device are performed.

To summarize, the present invention provides a silicon on insulator (SOI) device and forming method thereof, which forms negative carriers right next to an induced positive charge layer, to wipe out positive charges in the induced positive charge layer. In one embodiment, a wafer including a top silicon layer disposed on a buried oxide layer is provided, a trap-rich layer having nano-dots and an oxide layer are stacked on a high resistivity substrate sequentially, and then the oxide layer is bonded with the buried oxide layer. By doing this, negative carriers trapped in dangling bonds of the trap-rich layer wipe out positive charges of a positive fixed charge layer induced at a surface of the buried oxide layer contacting the oxide layer. In another embodiment, a wafer including a top silicon layer disposed on a buried oxide layer is provided, a high resistivity substrate is bonded with the buried oxide layer, and a doped negative charge layer is doped right next to a positive fixed charge layer induced at a surface of the buried oxide layer contacting the high resistivity substrate. By doing this, negative carriers of the doped negative charge layer wipe out positive charges of the positive fixed charge layer. By applying the present invention, parasitic surface conduction (PSC) channels in the substrate are canceled, effective resistivity of the substrate is increased, and harmonic distortion and substrate loss is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a silicon on insulator (SOI) device, comprising:
   providing a wafer comprising a bottom silicon substrate, a buried oxide layer and a top silicon layer stacked from bottom to top;
   removing the bottom silicon substrate to expose the buried oxide layer;
   providing a high resistivity substrate;
   depositing a trap-rich layer on the high resistivity substrate, comprising:
      depositing a germanium layer on the high resistivity substrate; and
      annealing the germanium layer to form the trap-rich layer having germanium nano-dots;
   depositing an oxide layer on the trap-rich layer, wherein a thickness of the oxide layer is thinner than that of the buried oxide layer; and
   bonding the oxide layer with the buried oxide layer, wherein the germanium nano-dots have dangling bonds capable of trapping negative carriers to wipe out induced positive charges at an interface of the buried oxide layer and the oxide layer.

2. The method of forming a silicon on insulator (SOI) device according to claim 1, wherein a positive fixed charge layer is induced at the interface of the buried oxide layer contacting the oxide layer while negative carriers are trapped in the trap-rich layer.

3. The method of forming a silicon on insulator (SOI) device according to claim 1, further comprising:
   radio frequency devices disposed in the top silicon layer.

4. The method of forming a silicon on insulator (SOI) device according to claim 1, wherein steps of removing the bottom silicon substrate to expose the buried oxide layer comprise:
   forming a temporary substrate on the top silicon layer as a carrier substrate; and
   removing the bottom silicon substrate to expose the buried oxide layer.

5. The method of forming a silicon on insulator (SOI) device according to claim 4, further comprising:
   removing the temporary substrate after the oxide layer is bonded with the buried oxide layer.

* * * * *